(12) United States Patent
Cao

(10) Patent No.: US 7,075,147 B2
(45) Date of Patent: Jul. 11, 2006

(54) LOW ON RESISTANCE POWER MOSFET WITH VARIABLY SPACED TRENCHES AND OFFSET CONTACTS

(75) Inventor: Jianjun Cao, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/864,056

(22) Filed: Jun. 8, 2004

(65) Prior Publication Data

US 2005/0006700 A1   Jan. 13, 2005

Related U.S. Application Data

(60) Provisional application No. 60/478,004, filed on Jun. 11, 2003.

(51) Int. Cl.
*H01L 29/78* (2006.01)

(52) U.S. Cl. .................................. 257/331; 257/330
(58) Field of Classification Search ......... 257/329–331
See application file for complete search history.

(56) References Cited

U.S. PATENT DOCUMENTS

| 5,910,669 A | * | 6/1999 | Chang et al. | 257/339 |
| 6,060,747 A | * | 5/2000 | Okumura et al. | 257/331 |
| 6,084,264 A | * | 7/2000 | Darwish | 257/329 |

* cited by examiner

*Primary Examiner*—Gene M. Munson
(74) *Attorney, Agent, or Firm*—Ostrolenk, Faber, Gerb & Soffen, LLP

(57) ABSTRACT

A power semiconductor device of the trench variety in which the trenches follow a serpentine path.

10 Claims, 4 Drawing Sheets

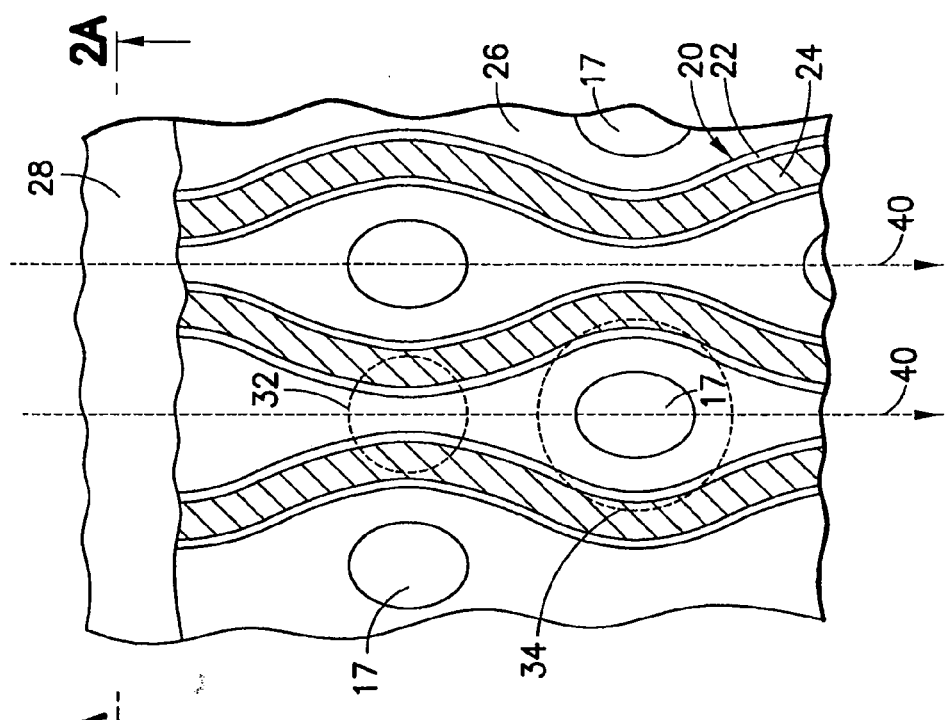
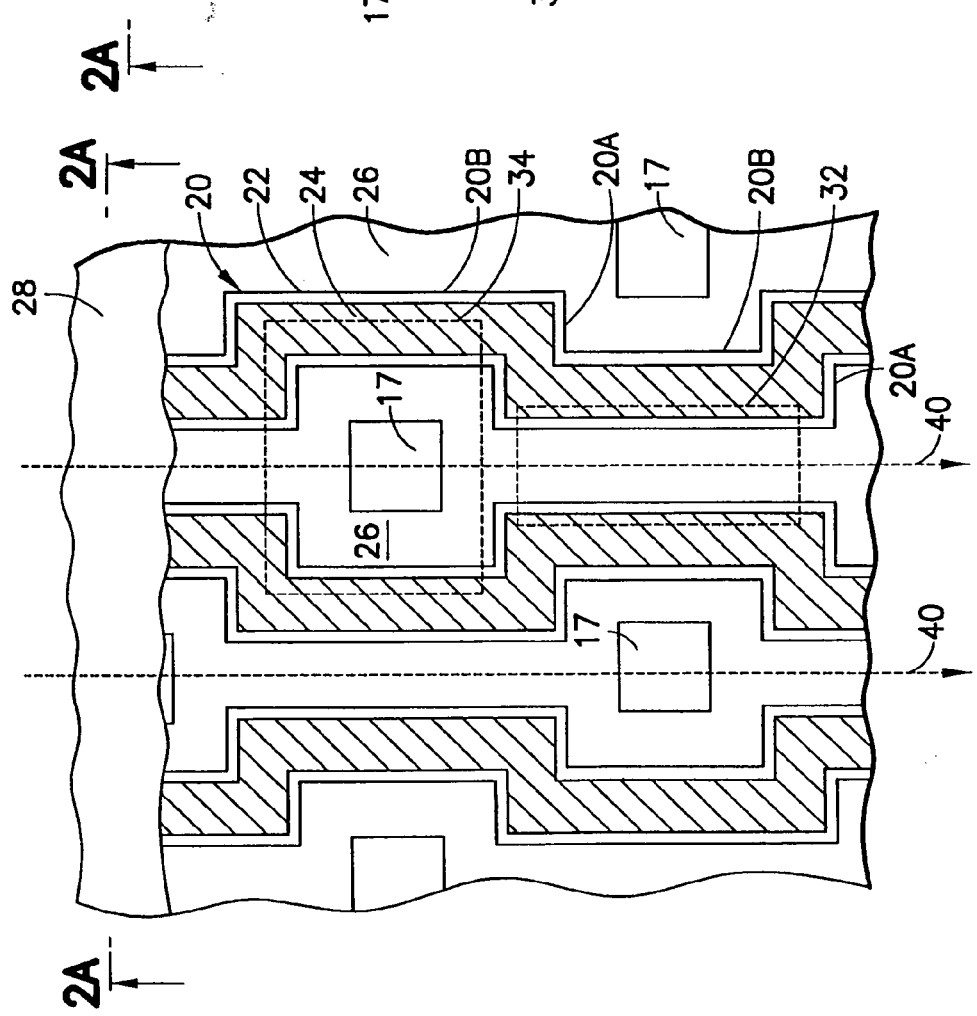

LOW ON RESISTANCE POWER MOSFET WITH VARIABLY SPACED TRENCHES AND OFFSET CONTACTS

RELATED APPLICATION

The present application is based on and claims benefit of U.S. Provisional Application No. 60/478,004, filed Jun. 11, 2003, entitled Low ON Resistance Power MOSFET with Variably Spaced Trenches and Offset Contacts, to which a claim of priority is hereby made.

BACKGROUND OF THE INVENTION

Power semiconductor devices, such as power MOSFETs, are widely used in electronic circuits. A function of a power device is to act as a switch that can be operated to regulate the supply of power. With the ever increasing demand for power supply to electronic devices such as, for example, portable computers, the ability of a power semiconductor device to handle larger current demands at a lower resistance is a highly sought after characteristic.

Referring to FIGS. 1A and 1B, a conventional power MOSFET includes, among other features, a plurality of parallel stripe trenches 20, which are formed in a base region 16. Each trench 20 supports a gate structure as is well known in the art.

Formed adjacent trenches 20 are source regions 26. In a typical device, source contact 28 makes electrical contact with source regions 26 and base region 16 in order to prevent parasitic devices from becoming operational.

In order to produce a device such as the one illustrated by FIGS. 1A and 1B, trenches 20 must be spaced far enough to allow source contact 28 to make good electrical contact with source regions 26 and base region 16. As a result, the density of trenches 20 (number of trenches per unit area), and thus the density of the active cells (density of the active cell being the number active cells occupied per unit area) in the device is limited by the space between trenches 20.

The limit on the density of active cells limits the power handling capability of the device. Specifically, increasing the cell density leads to a higher power capability typically with lower ON resistance (resistance of the device while operating), while lowering the cell density results in the opposite.

It would be desirable to have a structure and a method for increasing the cell density in a power semiconductor device in order to increase its power handling capability.

SUMMARY OF THE INVENTION

In a device according to the present invention trenches are formed to have a serpentine appearance. That is, unlike a stripe trench which advances along a single direction, a trench in a device according to the present invention changes direction, thereby creating a serpentine pattern.

Thus, for example, a trench may extend for a part thereof from a northwest position to a southeast position and then, in the next segment thereof, change direction and extend from a northeast position to a southwest position for another part thereof.

In an alternative serpentine pattern, a trench may change direction at a ninety degree angle to its common direction of advancement, extend from a west position to an east position for a part thereof, change direction to extend parallel to its common direction of advancement, and then change direction at a ninety degree angle to its common direction of advancement, and extend from an east position to a west position for another part thereof.

In yet another alternative serpentine pattern, a trench may change direction along a generally sinusoidal path.

According to one aspect of the present invention immediately adjacent trenches alternate in direction opposite to one another, thus forming a mirror image of one another. Such an arrangement allows the trenches to be brought closer to one another in some regions while spaced relatively farther apart in other regions. As a result, the trenches may be packed more densely in at least a portion of the device, thereby increasing the overall density of the active cells.

Additionally, the trenches may be spaced apart wide enough in some regions to allow enough room for the source contact.

The preferred embodiment of the present invention may be a power MOSFET, although other power semiconductor device such as IGBTs may equally benefit from the present invention.

Other features and advantages of the present invention will become apparent from the following description of the invention which refers to the accompanying drawings.

BRIEF DESCRIPTION OF THE DRAWING(S)

FIG. 3 shows a top plan view of a portion of a semiconductor device according to the second embodiment of the present invention.

FIG. 4 shows a top plan view of a portion of a semiconductor device according to the third embodiment of the present invention.

DETAILED DESCRIPTION OF THE FIGURES

Figure 2A:
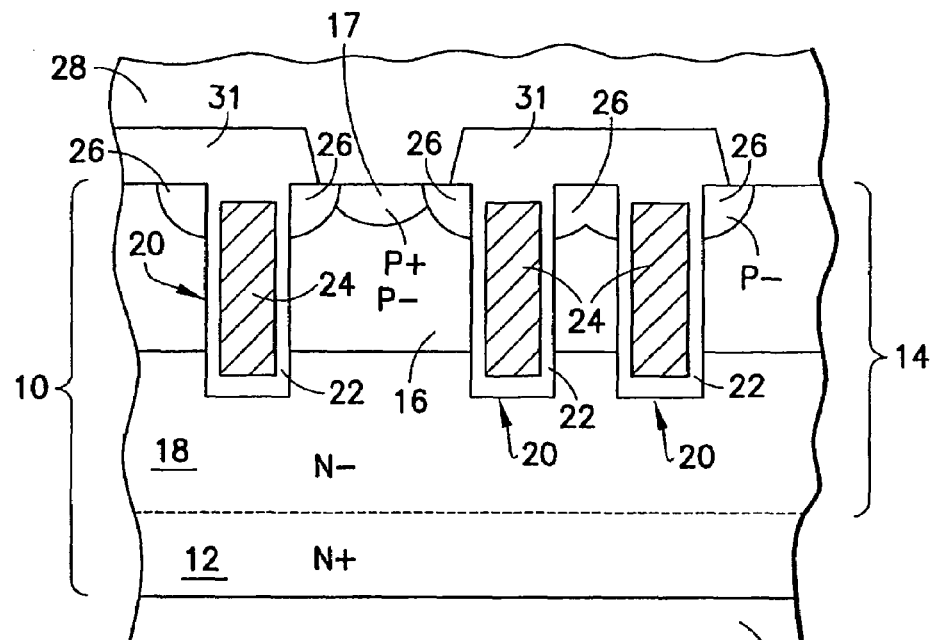
FIG. 2A is a cross-sectional view of a portion of a semiconductor device according to the present invention taken along line 2A—2A and viewed in the direction of the arrows in FIGS. 2B, 3, and 4.
Figure 2B:
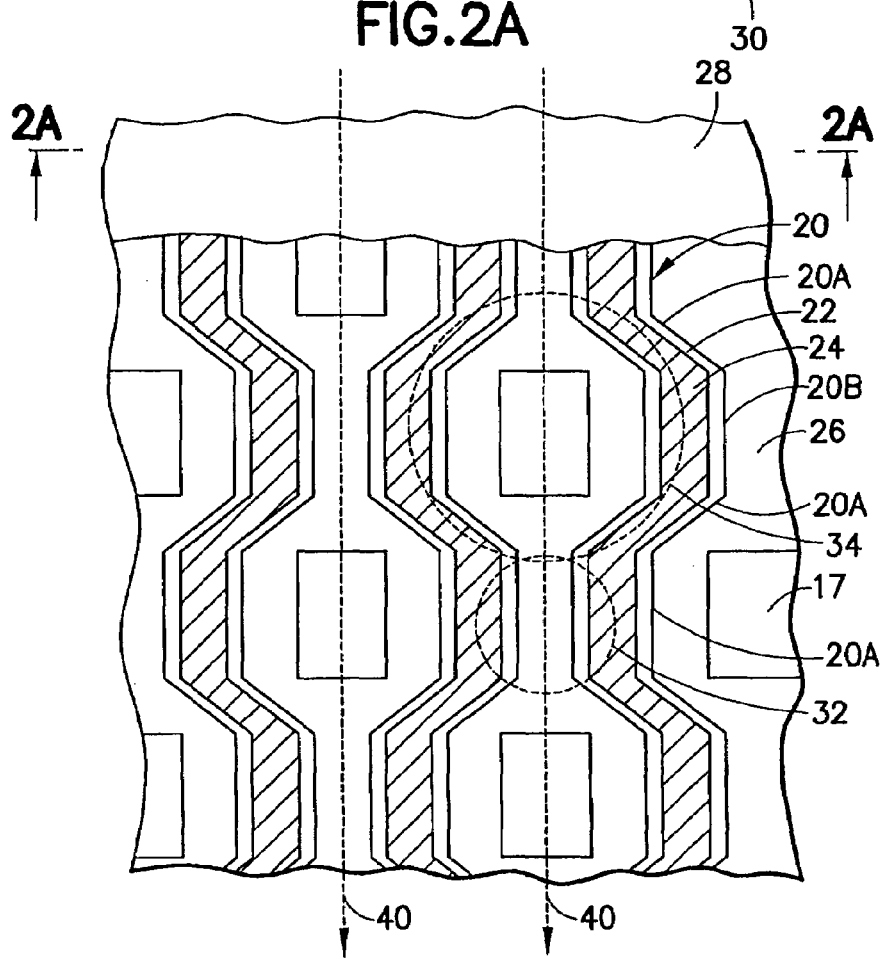
FIG. 2B shows a top plan view of a portion of a semiconductor device according to the first embodiment of the present invention.

Referring to FIGS. 2A and 2B, a power MOSFET according to the first embodiment of the present invention includes a semiconductor body 10 (preferably silicon) which is comprised of semiconductor substrate 12 and epitaxial semiconductor body 14, which is formed on one major surface of substrate 12. Formed in epitaxial semiconductor body 14 is base region 16. Base region 16 is over drift region 18.

As is well known, base region 16 and drift region 18 are of opposite conductivity. Thus, for example, base region 16 is of P conductivity type and drift region 18 is of N conductivity type. In a MOSFET according to the preferred embodiment of the present invention, substrate 12 is of the same conductivity as drift region 18 and serves as the drain portion of the device. Usually substrate 12 includes a higher concentration of dopants than drift region 18.

A MOSFET according to the present invention is of the trench variety and thus includes a plurality of trenches 20. Each trench 20 extends from the top of epitaxial semiconductor body 14 through base region 16 to drift region 18. Each trench 20 also supports a gate structure. Each gate structure includes gate electrode 24 and gate insulation 22, which insulates gate electrode 24 from the surrounding semiconductor material. Usually, gate electrode 24 is comprised of conductive polysilicon and gate insulation 22 is comprised of silicon dioxide, although other materials can be used.

Extending from the top surface of epitaxial semiconductor body 14 to a depth inside base region 16 are source regions 26. Source regions 26 are of the same conductivity as drift region 18 and thus at opposite conductivity to base region 16. Each source region 26 is disposed adjacent a sidewall of a trench 20. As is well known, a source region 26 can become electrically connected to drift region 18 upon application of an appropriate voltage to a gate electrode 24. Specifically, the application of an appropriate voltage to a gate electrode 22 causes the formation of a channel in base region 16 adjacent gate insulation 22 adjacent thereto. The channel so formed is of the same conductivity as source region 26 and drift region 18, thereby allowing electrical connection between the two.

The scheme described above for connecting a source region 26 to drift region 18 is commonly referred to as inversion. That is, by inverting a portion of base region 16 adjacent a trench 20, source region 26 adjacent thereto and drift region 18, which are normally electrically disconnected, may be electrically connected selectively.

Another well known scheme for causing the selective flow of current is commonly referred to as "depletion mode", in which source region 26 and drift region 18 are usually electrically connected until an appropriate voltage is applied to disconnect the two regions. It should be understood that the present invention is not limited to either mode, but that each mode is equally within the scope and spirit of the present invention.

A MOSFET according to the present invention further includes source contact 28. Source contact 28 is electrically insulated from gate electrodes 22 by insulation plugs 31 which are disposed at the top of each trench 20. Source contact 28 is, however, in electrical contact with source regions 26. In addition, source contact 28 is in electrical contact with base region 16, whereby source contact 28 shorts base region 16 and source regions 26 to prevent a parasitic bipolar device from being turned on, as is well known in the art. Usually, as is shown in FIG. 1B, a high conductivity low resistivity region of the same conductivity as that of base region 16 is formed in base region 16 to lower the resistance of contact with source contact 28, the purpose of which is the prevention of the operation of the parasitic devices in the MOSFET.

A MOSFET according to the present invention further includes drain contact 30 which is in electrical contact with substrate 12.

In the preferred embodiment, source contact 28 and drain contact 30 may be formed from aluminum or aluminum silicon, and may include a solderable body of, for example, a trimetal combination formed thereon. It should be noted that other materials or combination of materials may be used without deviating from the scope and spirit of the present invention.

Figure 1A:
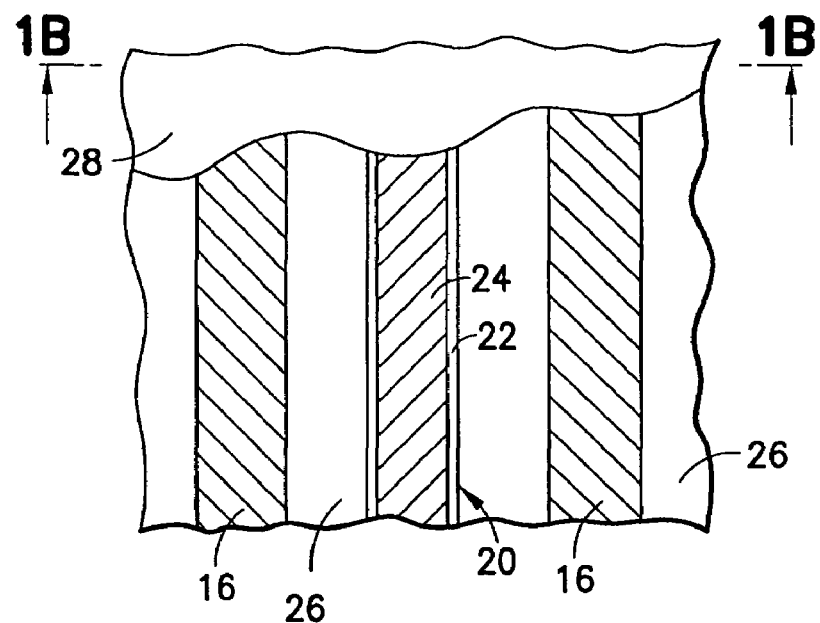
FIG. 1A is a top plan view of a portion of a semiconductor device according the prior art having a portion thereof removed to illustrate the pattern of its trenches.
Figure 1B:
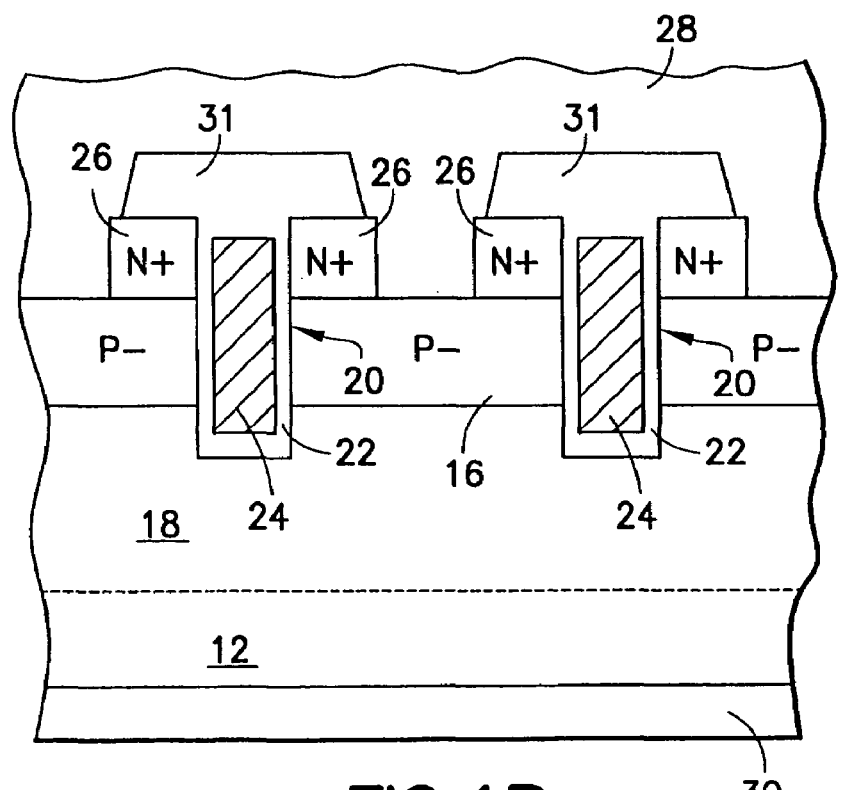
FIG. 1B shows a cross-sectional view of a portion of a semiconductor device according to prior art along line 1B—B in FIG. 1A.

In a prior art device, such as the one illustrated by FIGS. 1A and 1B, trenches 20 are parallel stripes spaced at an equal distance from one another. In the prior art, to ensure that source contact 28 makes a good electrical contact with base region 16, trenches 20 have to be spaced a certain minimum distance. As a result, in a prior art device, the density of the trenches (number of trenches per unit die area) cannot be reduced below a certain limit.

Increasing the total density of trenches is desirable as it increases the total channel area and thus increases the current carrying capability of the device.

According to the present invention, trenches 20 are formed to have a serpentine shape. The serpentine shape allows trenches to become closely spaced in some regions, e.g. region 32, and further apart in some regions, e.g. region 34. By reducing the distance between trenches 20 in some regions the overall density of trenches is increased, thereby allowing for a higher current carrying capability.

On the other hand by increasing the space between trenches 20 in some parts, e.g. region 34, enough room may be provided to allow source contact 28 to make good electrical contact with base region 16.

Referring to FIG. 2B, a serpentine pattern may include portions that alternately change direction. Thus, as shown in FIG. 2B, in a device according to the first embodiment of the present invention, each trench 20 includes a portion 20A that extends at an angle to the common direction of advancement 40 (the common direction along which trenches 20 advance) of trenches 20, and portions 20B that extend parallel to the common direction of advancement 40.

In the first embodiment of the present invention, each portion 20A is connected to a portion 20B at one end thereof. Furthermore, in the first embodiment each portion 20A extends at an angle to the common direction of advancement which is not equal to ninety degrees. As seen in FIG. 2B, portions 20A alternately change direction in order create a serpentine appearance. Thus, one portion 20A extends from a northwest position to a southeast position, while the next portion 20A extends from a northeast position to a southwest position.

Referring now to FIG. 3, in a device according to the second embodiment of the present invention, portions 20A extend at a ninety degree angle to the common direction of advancement 40.

Referring to FIG. 4, in a device according to the third embodiment of the present invention, trenches 20 are formed of curves that alternate in direction in order to form a generally sinusoidal pattern.

According to one aspect of the present invention adjacently disposed trenches change direction opposite to one another, thereby forming mirror images of one another. As a result, adjacently disposed trenches 20 become spaced from one another by a region which alternately includes regions 32 and regions 34.

Figure 5:
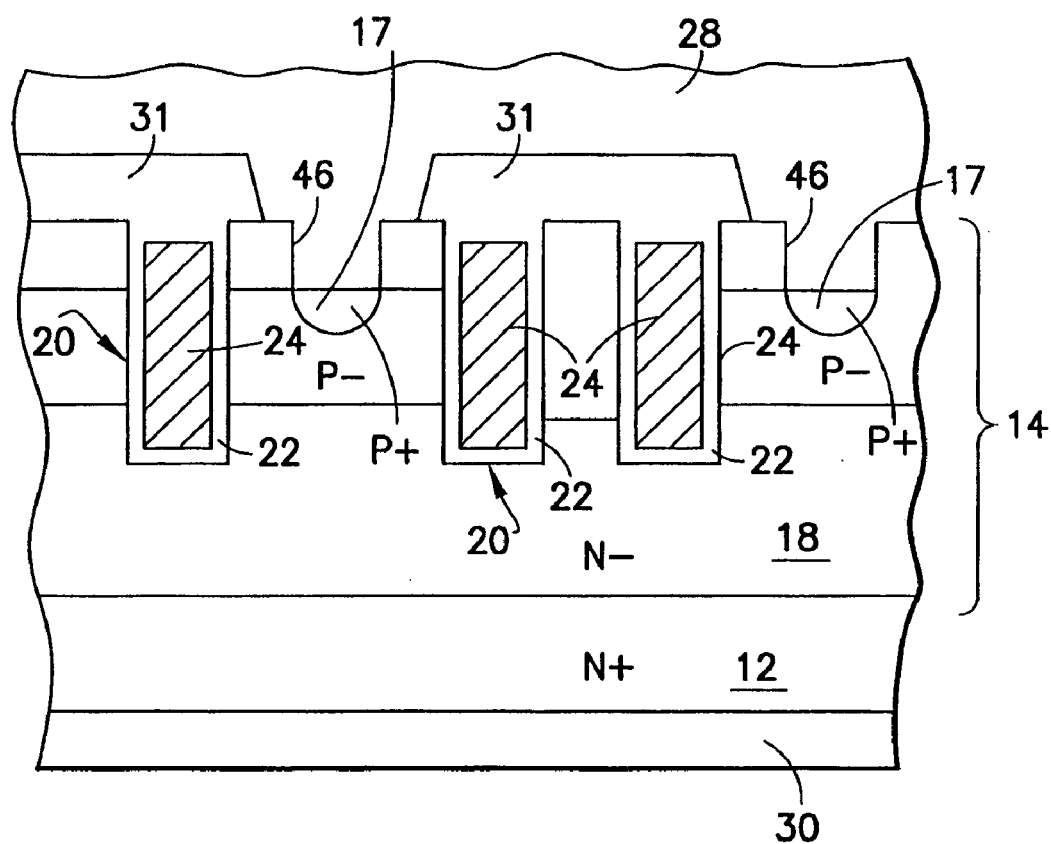
FIG. 5 shows a semiconductor device according to the fourth embodiment of the present invention.

A device according to the present invention may be varied without deviating from the scope and spirit of the present invention. Referring, for example, to FIG. 5, in a fourth embodiment, recess 46 is provided to reach base region 16, rather than having base region reach the top surface of epitaxial layer 14.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOS-gated semiconductor power device comprising:
   a semiconductor body having a first major surface and a second opposing major surface;
   a base region of a first conductivity type formed in said semiconductor body below said first major surface;

a first trench and a second trench formed in said semiconductor body, said first trench being spaced from said second trench by a first semiconductor region and a second semiconductor region, said first region being wider than said second region, and including access to said base region;

a gate structure formed in each of said trenches;

a conductive region of a second conductivity type formed adjacent each of said trenches; and an external contact in electrical contact with said conductive regions of said second conductivity type and said base region at said first region; wherein said trenches follow a serpentine path, wherein said trenches advance along a common direction of advancement, and wherein said serpentine path is comprised of smooth curves that together form a sinusoidal pattern.

2. A MOS-gated semiconductor power device according to claim 1, wherein said trenches are mirror images of one another.

3. A MOS-gated semiconductor power device according to claim 1, wherein said conductive regions are source regions and said external contact is a source contact.

4. A MOS-gated semiconductor power device according to claim 1, further comprising low resistivity regions formed in said base region and in electrical contact with said external contact.

5. A MOS-gated semiconductor power device comprising:
a silicon body having a first major surface and a second opposing major surface, and including a substrate portion and an epitaxial portion formed over a major surface of said substrate portion;
a base region of a first conductivity type formed in said epitaxial portion below said first major surface of said silicon body;
a first trench and a second trench formed in said epitaxial portion, said first trench being spaced from said second trench by a first silicon region and a second silicon region, said first region being wider than said second region;

a gate structure formed in each of said trenches;

a conductive region of a second conductivity type formed adjacent each of said trenches; and an external contact in electrical contact with said conductive regions of said second conductivity type and making electrical connection to said base region; wherein said trenches follow a serpentine path, and wherein said serpentine path is generally sinusoidal and is comprised of smooth curves that alternately change direction.

6. A MOS-gated semiconductor power device according to claim 5, wherein said trenches are mirror images of one another.

7. A MOS-gated semiconductor power device according to claim 5, wherein said conductive regions are source regions and said external contact is a source contact.

8. A MOS-gated semiconductor power device according to claim 5, further comprising low resistivity regions formed in said base region in electrical contact with said external contact.

9. A MOS-gated semiconductor power device according to claim 5, further comprising another external contact in electrical contact with said substrate.

10. A MOS-gated semiconductor power device according to claim 9, wherein said external contact is a drain contact.

* * * * *